US010451318B2

(12) United States Patent
Stautner

(10) Patent No.: US 10,451,318 B2
(45) Date of Patent: Oct. 22, 2019

(54) CRYOGENIC COOLING SYSTEM AND METHOD

(71) Applicant: General Electric Company, Schenectady, NY (US)

(72) Inventor: Ernst Wolfgang Stautner, Niskayuna, NY (US)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 241 days.

(21) Appl. No.: 15/381,355

(22) Filed: Dec. 16, 2016

(65) Prior Publication Data

US 2018/0172319 A1    Jun. 21, 2018

(51) Int. Cl.
| | |
|---|---|
| *G01V 3/00* | (2006.01) |
| *F25B 9/14* | (2006.01) |
| *G01R 33/38* | (2006.01) |
| *G01R 33/3815* | (2006.01) |

(52) U.S. Cl.
CPC ............ *F25B 9/14* (2013.01); *G01R 33/3804* (2013.01); *F25B 2309/14181* (2013.01); *G01R 33/3815* (2013.01)

(58) Field of Classification Search
CPC .............. G01R 33/5608; G01R 33/543; G01R 33/3815; G01R 33/3804; A61B 5/055
USPC ....................................................... 324/322
See application file for complete search history.

(56) References Cited

U.S. PATENT DOCUMENTS

| 6,412,289 | B1 * | 7/2002 | Laskaris ................ H02K 9/193 |
| | | | 277/347 |
| 8,033,121 | B2 | 10/2011 | Huang et al. |
| 8,374,663 | B2 | 2/2013 | Laskaris et al. |
| 8,797,131 | B2 | 8/2014 | Jiang |
| 9,074,798 | B2 | 7/2015 | Ackermann et al. |
| 9,230,724 | B2 | 1/2016 | Harrison |
| 2010/0200594 | A1 | 8/2010 | Husband et al. |
| 2012/0011858 | A1 * | 1/2012 | Park .......................... F16K 3/26 |
| | | | 62/6 |
| 2013/0008187 | A1 * | 1/2013 | Kraus ....................... F17C 3/08 |
| | | | 62/51.1 |

(Continued)

OTHER PUBLICATIONS

Ackermann et al., "Advanced Cryocooler Cooling for MRI Systems", Kluwer Academic Publishers, pp. 857-867, 1999.

(Continued)

*Primary Examiner* — Walter L Lindsay, Jr.
*Assistant Examiner* — Frederick Wenderoth

(57) ABSTRACT

A cryogenic cooling system (CCS) includes a cylindrical housing having a first end and a second end. Also, the CCS includes a displacer disposed within the cylindrical housing and reciprocatingly driven between the first end and the second end of the cylindrical housing to compress or expand a refrigerant gas in a gas chamber. Further, the CCS includes a tubing unit coupled to the second end of the cylindrical housing and disposed adjacent to the at least one superconducting unit, wherein the tubing unit is configured to circulate the refrigerant gas received from the cylindrical housing through the tubing unit to absorb the at least one heat load imposed on the at least one superconducting unit to generate heated refrigerant gas, and convey the heated refrigerant gas to the gas chamber of the cylindrical housing to reduce or maintain a temperature of the at least one superconducting unit.

20 Claims, 6 Drawing Sheets

(56) References Cited

U.S. PATENT DOCUMENTS

| | | | | |
|---|---|---|---|---|
| 2013/0104570 A1* | 5/2013 | Stautner | ............ | G01R 33/3804 |
| | | | | 62/45.1 |
| 2014/0100114 A1* | 4/2014 | Stautner | ................ | H02K 55/00 |
| | | | | 505/163 |
| 2015/0300569 A1* | 10/2015 | Baust | ........................ | F17C 5/02 |
| | | | | 62/50.1 |
| 2015/0332830 A1 | 11/2015 | Jiang et al. | | |

OTHER PUBLICATIONS

Feller et al., "Distributed Cooling Techniques for Cryogenic Boil-Off Reduction Systems", International Cryocooler Conference Inc, Boulder, CO, pp. 631-635, 2009.

Wang et al., "A Compact Cold Helium Circulation System with GM Cryocooler", Cryocooler. org, pp. 1-7, 2014.

* cited by examiner

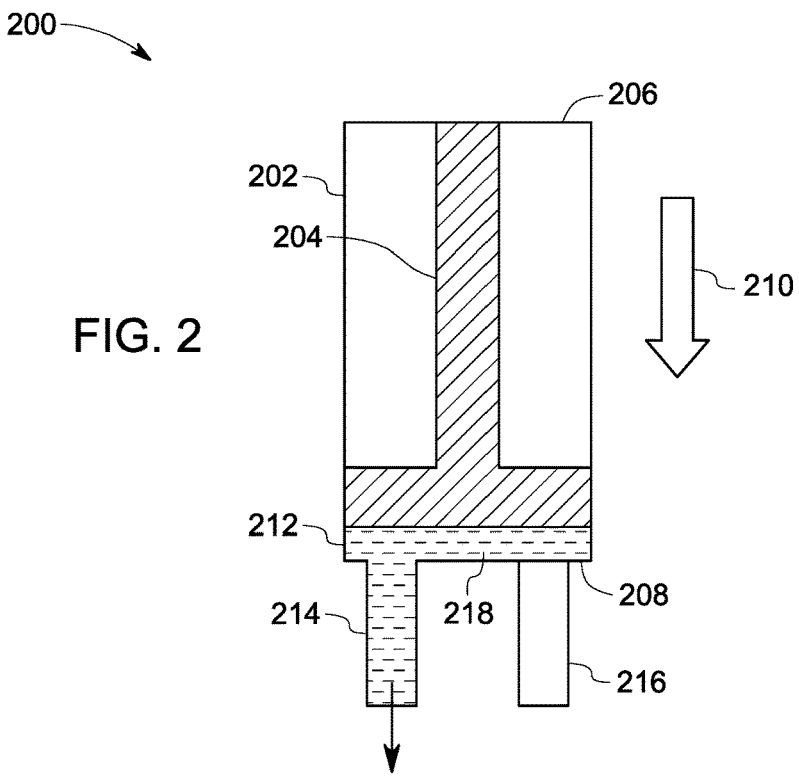
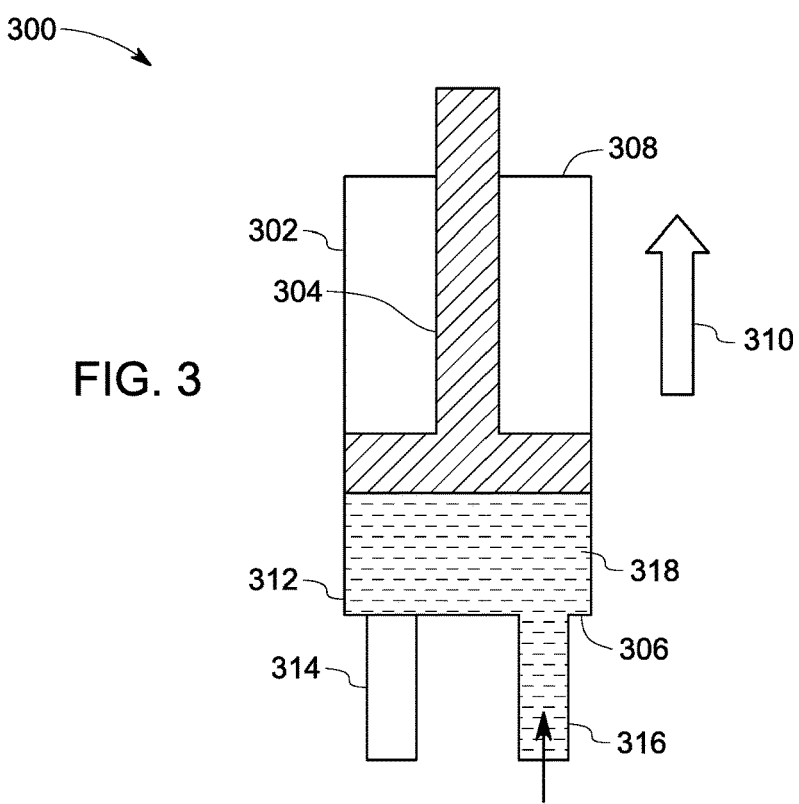

CRYOGENIC COOLING SYSTEM AND METHOD

BACKGROUND

Embodiments of the present specification relate generally to magnetic resonance imaging (MRI) systems, and more particularly relate to a cryogenic cooling system and method for cooling superconducting magnets in the MRI systems.

A superconducting magnet is used to produce a magnetic field in MRI systems. In some MRI systems, an electric current from a power source is constantly applied to the superconducting magnet to produce and maintain the magnetic field. However, production of such a strong magnetic field entails a constant supply of the electric current in a range of hundreds of amperes. This constant supply of electric current to the superconducting magnet increases the running cost of the MRI system.

Furthermore, in certain other techniques, the superconducting magnet may be subjected to different heat loads in the MRI system. It is desirable to transfer these heat loads away from the superconducting unit to maintain the superconducting magnet at a cryogenic temperature and to operate the superconducting magnet in the superconducting state. Moreover, it is also desirable to optimally dissipate the heat from the superconducting magnet to transition the superconducting magnet from a normal state to the superconducting state without high boil-off of cryogen in the MRI system.

In a conventional MRI system, superconducting magnets/coils are housed in a helium vessel containing about 1500-2000 liters of liquid helium (He) to provide immersion cooling of the superconducting magnets/coils. Since this arrangement employs a large vessel with thousands of liters of liquid He, the arrangement is not only expensive to manufacture, but also cumbersome to transport and install at a desired location, such as, diagnostic centers. Additionally, delivery to remote locations of the refill of thousands of liters of liquid He may be inconvenient. Furthermore, conventional MRI magnet designs and their cooling arrangements may entail special installation requirements and high maintenance costs. In addition, installation of these systems in certain regions may be an onerous task. In other MRI magnet systems, the liquid helium is recondensed and hence the loss of liquid helium to the environment is reduced. However, in these systems, the limited crycooler liquefaction power demands a very tight control of the thermal budget to ensure zero boil off.

BRIEF DESCRIPTION

Briefly in accordance with one aspect of the present specification, a cryogenic cooling system configured to absorb at least one heat load imposed on at least one superconducting unit is presented. The cryogenic cooling system includes a cylindrical housing having a first end and a second end, wherein the cylindrical housing includes a gas chamber at the second end, and wherein the gas chamber is configured to house a refrigerant gas. Also, the cryogenic cooling system includes a displacer disposed within the cylindrical housing, wherein the displacer is reciprocatingly driven between the first end and the second end of the cylindrical housing to compress or expand the refrigerant gas in the gas chamber. Further, the cryogenic cooling system includes a tubing unit coupled to the second end of the cylindrical housing and disposed adjacent to the at least one superconducting unit, wherein the tubing unit is configured to circulate the refrigerant gas received from the cylindrical housing through the tubing unit to absorb the at least one heat load imposed on the at least one superconducting unit to generate heated refrigerant gas, and convey the heated refrigerant gas to the gas chamber of the cylindrical housing to reduce or maintain a temperature of the at least one superconducting unit.

In accordance with another aspect of the present specification, a method for absorbing at least one heat load imposed on at least one superconducting unit is presented. The method includes supplying a refrigerant gas to a gas chamber in a cylindrical housing of a cryogenic cooling system. Also, the method includes compressing the refrigerant gas in the gas chamber, wherein the refrigerant gas is compressed by driving a displacer in the cylindrical housing from a first end of the cylindrical housing to a second end of the cylindrical housing. Further, the method includes receiving, by a tubing unit, the refrigerant gas from the cylindrical housing when the displacer is driven towards the second end of the cylindrical housing. In addition, the method includes circulating the refrigerant gas through the tubing unit to absorb the at least one heat load imposed on the at least one superconducting unit to generate heated refrigerant gas. Furthermore, the method includes conveying the heated refrigerant gas to the gas chamber of the cylindrical housing to reduce or maintain a temperature of the at least one superconducting unit, wherein the heated refrigerant gas is conveyed to the gas chamber when the displacer is driven towards the first end of the cylindrical housing.

In accordance with yet another aspect of the present specification, a system is presented. The system includes a magnetic resonance imaging sub-system including at least one superconducting unit configured to produce a magnetic field. Also, the system includes a cryogenic cooling sub-system coupled to the at least one superconducting unit and configured to absorb at least one heat load imposed on the at least one superconducting unit, wherein the cryogenic cooling sub-system includes a cylindrical housing having a first end and a second end, wherein the cylindrical housing includes a gas chamber at the second end, and wherein the gas chamber is configured to house a refrigerant gas. Further, the cryogenic cooling sub-system includes a displacer disposed within the cylindrical housing, wherein the displacer is reciprocatingly driven between the first end and the second end of the cylindrical housing to compress or expand the refrigerant gas in the gas chamber. Moreover, the cryogenic cooling sub-system includes a tubing unit coupled to the second end of the cylindrical housing and disposed adjacent to the at least one superconducting unit, wherein the tubing unit is configured to circulate the refrigerant gas received from the cylindrical housing through the tubing unit to absorb the at least one heat load imposed on the at least one superconducting unit to generate heated refrigerant gas, and convey the heated refrigerant gas to the gas chamber of the cylindrical housing to reduce or maintain a temperature of the at least one superconducting unit.

DRAWINGS

These and other features, aspects, and advantages of the present invention will become better understood when the following detailed description is read with reference to the accompanying drawings in which like characters represent like parts throughout the drawings, wherein:

FIG. 2 is a cross-sectional view of a compression stroke in the cryogenic cooling system of FIG. 1, in accordance with aspects of the present specification;

FIG. 3 is a cross-sectional view of an expansion stroke in the cryogenic cooling system of FIG. 1, in accordance with aspects of the present specification;

DETAILED DESCRIPTION

As will be described in detail hereinafter, various embodiments of an exemplary cryogenic cooling system and methods for cooling superconducting magnets/coils are presented. By employing the methods and the various embodiments of the cryogenic cooling system described hereinafter, a volume of a refrigerant gas, a size of magnetic devices, costs associated with manufacturing, installation, and running the magnetic devices, such as magnetic resonance imaging (MRI) systems may be substantially reduced.

Figure 1:
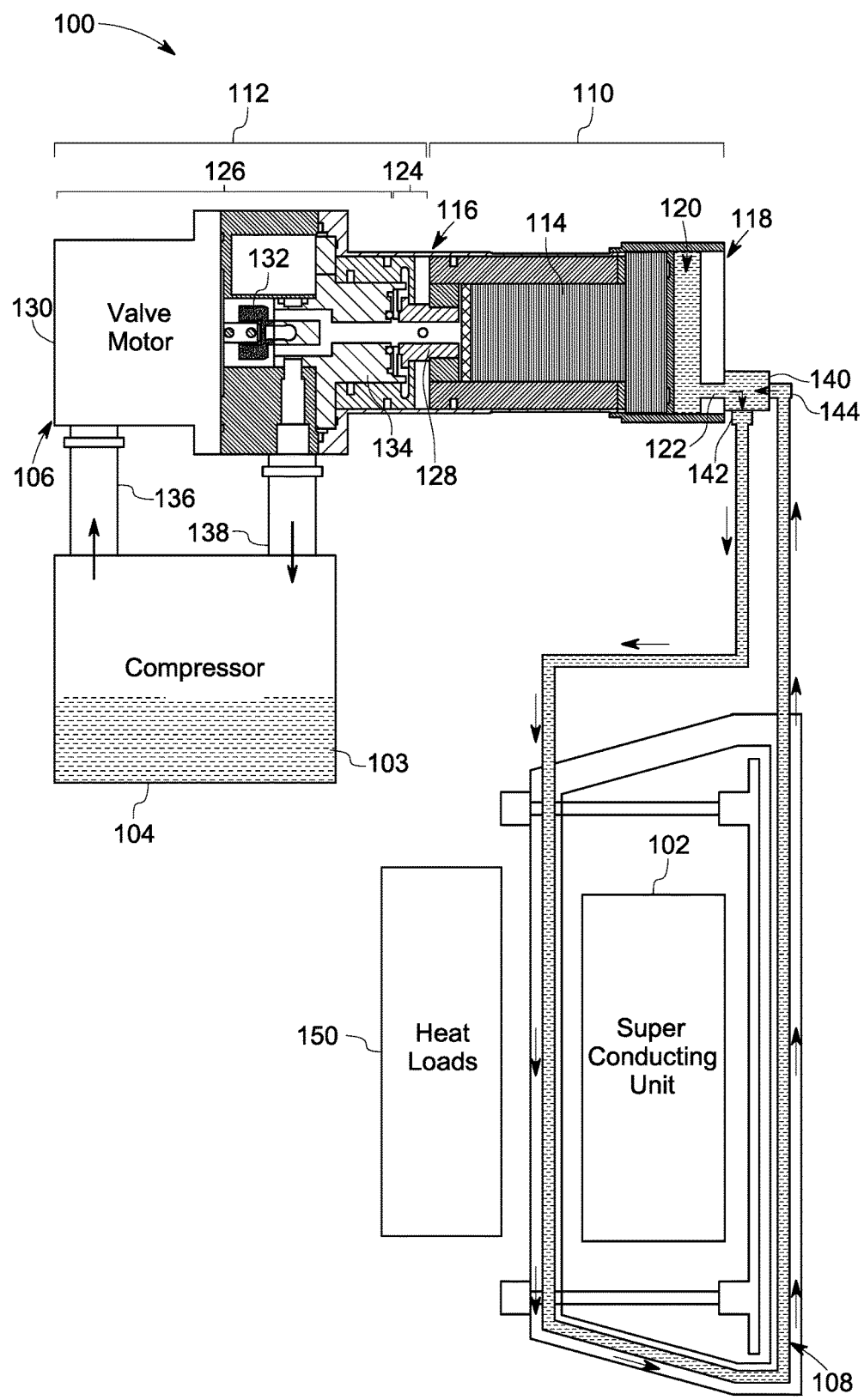
FIG. 1 is a cross-sectional view of a cryogenic cooling system, in accordance with aspects of the present specification.

Turning now to the drawings, and referring to FIG. 1, a cross-sectional view of a cryogenic cooling system 100, in accordance with aspects of the present specification, is depicted. The cryogenic cooling system 100 may be configured to maintain a temperature of a superconducting unit 102 of an MRI system (see FIG. 6) at or below a cryogenic temperature. Also, in certain embodiments, the cryogenic cooling system 100 may be disposed in a vacuum chamber of the MRI system. It may be noted that the implementation of the cryogenic cooling system 100 is not limited to MRI systems, and may be implemented in other devices, such as superconducting electrical machines, superconducting magnet energy storage systems (SMES), super conducting (SC) accelerators, and the like. Also, these devices may be used in other applications, such as the renewable energy storage systems, and is not limited to the MRI application.

The superconducting unit 102 may include superconducting magnets and/or coils, a gradient assembly, and their supporting structure. The cryogenic cooling system 100 is configured to absorb heat loads 150 that are imposed on the superconducting unit 102. In one example, these heat loads 150 may be due to high echo-planar imaging (EPI) gradient switching sequences in the MRI system. In another example, these heat loads 150 may be due to varying thermal radiation from a vacuum space in the MRI system to the superconducting coils in the superconducting unit 102. As will be appreciated, it is desirable to maintain the superconducting unit 102 at or below the cryogenic temperature. Accordingly, the cryogenic cooling system 100 is configured to absorb these heat loads 150, thereby reducing and/or preventing these heat loads 150 from reaching the superconducting unit 102. Absorption of the heat loads 150 by the cryogenic cooling system 100 aids in maintaining the temperature of the superconducting unit 102 at or below the cryogenic temperature. The term cryogenic temperature is used to refer to a temperature at or below which the superconducting unit 102 is designed to operate in a superconducting state. In one embodiment, the cryogenic temperature may be in a range from about 3.5 K to about 6 K.

In a presently contemplated configuration, the cryogenic cooling system 100 includes a compressor 104, a cryogenic cooler 106, and a tubing unit 108. The compressor 104 is configured to store a refrigerant gas 103 that is used for absorbing the heat loads 150, which in turn aids in maintaining the superconducting unit 102 at the cryogenic temperature. The refrigerant gas 103 may include helium (He). In one embodiment, the superconducting unit 102 may be a low temperature superconductor, a medium temperature superconductor, or a high temperature superconductor. For example, the superconducting unit 102 having a low temperature superconductor may employ He as the refrigerant/coolant. Moreover, in certain embodiments, the compressor includes an outlet 136 and an inlet 138. The outlet 136 is used to convey the refrigerant gas 103 out of the compressor 104, while the inlet 138 is employed to convey the refrigerant gas 103 back to the compressor 104.

Further, the cryogenic cooler 106 is coupled to the compressor 104 and the tubing unit 108. The cryogenic cooler 106 may be configured to receive the refrigerant gas 103 from the compressor 104 and convey at least a portion of the received refrigerant gas 103 to the tubing unit 108. Also, the cryogenic cooler 106 may be configured to receive a heated refrigerant gas from the tubing unit 108 and convey the heated refrigerant gas to the compressor 104. In one example, the cryogenic cooler 106 may be a Gifford-McMahon (GM) cooler having a single-stage displacer or a multi-stage displacer. In another example, the cryogenic cooler 106 may be a pulse tube cooler without a solid displacer.

As depicted in FIG. 1, the cryogenic cooler 106 includes a cylindrical housing 110 and a valve assembly 112. The cylindrical housing 110 includes a displacer 114 that is reciprocatingly driven between a first end 116 and a second end 118 of the cylindrical housing 110. In certain embodiments, a pneumatic-drive mechanism may be used to drive the displacer 114 between the first and second ends 116, 118 of the cylindrical housing 112. In other embodiments, the displacer 114 may be driven within the cylindrical housing 110 using a mechanical-drive mechanism. Also, the cylindrical housing 110 includes a gas chamber 120 disposed at the second end 118 of the cylindrical housing 112. The gas chamber 120 is used for storing the refrigerant gas 103 received from the compressor 104. In addition, the cylindrical housing 110 includes a port 122 at the second end 118. The port 122 is employed for conveying the refrigerant gas 103 to the tubing unit 108.

Furthermore, the valve assembly 112 is coupled to the first end 116 of the cylindrical housing 110 and configured to drive the displacer 114 between the first end 116 and the second end 118 of the cylindrical housing 110. In one embodiment, the valve assembly 112 includes a drive unit 124 and a valve unit 126. The drive unit 124 is coupled to the displacer 114 at the first end 116 of the cylindrical housing 110, while the valve unit 126 is coupled to the drive unit 124 and the compressor 104, as depicted in FIG. 1. It may be noted that the cryogenic cooler 106 may include other components, and is not limited to the components shown in FIG. 1.

In general, the cryogenic cooler 106 may undergo a sequence of compression and expansion strokes to aid in the absorption of the heat loads 150 that are imposed on the superconducting unit 102. This in turn restricts/prevents these heat loads 150 from reaching the superconducting unit 102. In one example, the drive unit 124 is configured to drive the displacer 114 between the first end 116 and the second end 118 in the cylindrical housing 110 to perform the compression stroke and the expansion stroke of the cryogenic cooler 106. The compression stroke is representative of a state of the cylindrical housing 110 where the displacer 114 is driven from the first end 116 to the second end 118 of the cylindrical housing 110. In a similar manner, the expansion stroke is representative of a state of the cylindrical housing 110 where the displacer 114 is driven from the second end 118 to the first end 116 of the cylindrical housing 110. It may be noted that the compression stroke and the expansion stroke may also be performed repeatedly or cyclically based on a conventional thermodynamic cycle of the cryogenic cooler 106 and/or based on the occurrence of the heat loads 150 in the MRI system. In one example, the drive unit 124 may include a drive stem 128 that is fastened to the displacer 114 at the first end 116 of the cylindrical housing 110. Further, this drive stem 128 is pneumatically driven to displace the displacer 114 between the first end 116 and the second end 118 of the cylindrical housing 110.

The valve unit 126 is configured to convey the refrigerant gas 103 from the compressor 104 to the gas chamber 120 in the cylindrical housing 110. Also, the valve unit 126 is configured to convey the heated refrigerant gas from the gas chamber 120 in the cylindrical housing 110 to the compressor 104. In one example, the valve unit 126 may include a valve motor 130, a rotary valve 132, and a valve stem 134. The various components 130, 132, 134 of the valve unit 126 are used to control a flow of the refrigerant gas 103 in the cylindrical housing 110. In one embodiment, the valve unit 126 is coupled to the outlet 136 and the inlet 138 of the compressor 104.

Further, during the compression stroke of the cryogenic cooler 106, the valve motor 130 rotates the rotary valve 132 to convey the refrigerant gas 103 from the compressor 104 via the outlet 136 of the compressor 104 to the cylindrical housing 110 using the valve stem 134 and the drive stem 128. In one example, this refrigerant gas 103 may be a high-pressure gas. The high-pressure gas may have a pressure in a range from about 2.3 MPa to 2.8 MPa. Similarly, during the expansion stroke of the cryogenic cooler 106, the valve motor 130 rotates the rotary valve 132 to convey the heated refrigerant gas from the cylindrical housing 110 to the compressor 104 via the inlet 138 using the valve stem 134 and the drive stem 128. In one example, the heated refrigerant gas may be a low-pressure gas. Also, the low-pressure gas may have a pressure in a range from about 1.7 MPa to 2.2 MPa.

In one embodiment, the tubing unit 108 is coupled to the second end 118 of the cylindrical housing 110. The tubing unit 108 includes a gas valve 140 that is coupled to the port 122 at the second end 118 of the cylindrical housing 110. Further, an inlet 142 and an outlet 144 of the tubing unit 108 are coupled to the gas valve 140, as depicted in FIG. 1. Moreover, the gas valve 140 may be switched between a first position and a second position to control the flow of the refrigerant gas in the tubing unit 108. More specifically, positioning the gas valve 140 in the first position aids in coupling the inlet 142 of the tubing unit 108 to the port 122. Similarly, positioning the gas valve 140 in the second position aids in coupling the outlet 144 of the tubing unit 108 to the port 122.

Moreover, in one embodiment, the tubing unit 108 may include a plurality of capillaries (see FIG. 4) that is disposed adjacent to the superconducting unit 102. These capillaries are used absorb the heat loads 150 and transfer the heat loads 150 to the refrigerant gas circulating in the capillaries. In one example, the plurality of capillaries includes a serpentine capillaries and/or circular capillaries. In another embodiment, the tubing unit 108 may include a thermal shield having a plurality of imprinted tubes (see FIG. 4) that is disposed adjacent to the superconducting unit 102. In one example, the imprinted tubes may be representative of a hollow passage or a tube-like structure formed within the thermal shield for conveying the refrigerant gas. Also, these imprinted tubes are used to absorb the heat loads 150 and transfer these absorbed heat loads 150 to the refrigerant gas that is conveyed in the imprinted tubes. In one embodiment, the tubing unit 108 may be formed using stainless steel, aluminum, copper, and the like. Further, in one embodiment, the tubing unit 108 may have a diameter in a range from about 0.58 mm to about 10 mm.

During operation of the cryogenic cooling system 100, the compressor 104 is filled with the refrigerant gas 103. Further, during the compression stroke of the cryogenic cooler 106, the refrigerant gas 103 is conveyed from the outlet 136 of the compressor 104 to the gas chamber 120 in the cylindrical housing 110 via the valve stem 134 and the drive stem 128.

Once the gas chamber 120 is filled with the refrigerant gas 103, the displacer 114 is driven from the first end 116 to the second end 118 of the cylindrical housing 110 to compress the refrigerant gas 103 in the gas chamber 120. Compressing the refrigerant gas 103 in the gas chamber 120 results in an increase in the pressure of the refrigerant gas. In certain situations, the pressure of the refrigerant gas may exceed a threshold value. If the pressure of the refrigerant gas exceeds the threshold value, the gas valve 140 of the tubing unit 108 is turned to the first position to convey the refrigerant gas from the gas chamber 120 to the inlet 142 of the tubing unit 108 via the port 122. In one example, the gas valve 140 may be automatically or manually turned to the first position based on the pressure of the refrigerant gas 103 in the gas chamber 120.

In addition, the refrigerant gas is conveyed through the tubing unit 108 from the inlet 142 of the tubing unit 108 to the outlet 144 of the tubing unit 108. In one example, the pressure of the refrigerant gas 103 may aid in circulating the refrigerant gas 103 through the tubing unit 108 without the use of any external pump.

Moreover, the tubing unit 108 may absorb the heat loads 150 that are imposed on the superconducting unit 102 and transfer the absorbed heat loads 150 to the refrigerant gas in the tubing unit 108. This absorption of the heat loads 150 by the tubing unit 108 aids in cooling or maintaining the temperature of the superconducting unit 102 at or below the cryogenic temperature. Also, the refrigerant gas is heated due to transfer of the absorbed heat loads 150 to the refrigerant gas in the tubing unit 108.

Further, during the expansion stroke of the cryogenic cooler 106, the displacer 114 is driven from the second end 118 to the first end 116 of the cylindrical housing 110 to expand the refrigerant gas in the gas chamber 120. This expansion of the refrigerant gas may result in a gradual decrease in the pressure of the refrigerant gas. In certain situations, the pressure of the expanding refrigerant gas may be reduced below the threshold value. If the pressure of the refrigerant gas drops below the threshold value, the gas valve 140 is turned to the second position to receive the heated refrigerant gas from the outlet 144 of the tubing unit 108. In one example, the gas valve 140 may be automatically or manually turned to the second position based on the pressure of the refrigerant gas.

Moreover, during the expansion stroke of the cryogenic cooler 106, the heated refrigerant gas is conveyed from the gas chamber 120 to the inlet 138 of the compressor 104 via the valve stem 134 and the drive stem 128. Further, this heated refrigerant gas is collected in the compressor 104 via the inlet 138. Further, the cryogenic cooler 106 may repeat this cycle of supplying the refrigerant gas to the tubing unit 108 and receiving the heated refrigerant gas from the tubing unit 108 to transfer the heat loads 150 away from the superconducting unit 102. This in turn aids in reducing the temperature of the superconducting unit 102 to the cryogenic temperature or below the cryogenic temperature.

It may be noted that in a conventional bath-cooled MRI system, the superconducting unit is typically immersed in a coolant vessel containing liquid He. While cooling the superconducting unit, the liquid He is evaporated and vented out of the MRI system to an external environment. Further, to compensate for this vented liquid He, the coolant vessel is re-filled with liquid He, which is an expensive and time consuming process. In addition, this arrangement requires few hundreds of liters of liquid He to re-fill the coolant vessel. Some or all of these shortcomings of the currently available system may be circumvented via use of the exemplary cryogenic cooling system 100.

In accordance with aspects of the present specification, the compressor 104 and the tubing unit 108 of the cryogenic cooling system 100 are filled with about 10 liters of the refrigerant gas 103. This reduced amount of refrigerant gas 103 is efficiently utilized by conveying the refrigerant gas 103 through the tubing unit 108 and receiving the heated refrigerant gas from the tubing unit 108. Particularly, the refrigerant gas is conveyed through the tubing unit 108 and received from the tubing unit 108 by using the cryogenic cooler 106. Conveying the refrigerant gas through the tubing unit 108 and receiving the heated refrigerant gas from the tubing unit 108 as described hereinabove enhances the transfer of the heat loads 150 away from the superconducting unit 102, which in turn minimizes the boil-off of the refrigerant gas. This reduction in the refrigerant gas boil-off advantageously minimizes the need for refilling the refrigerant gas in the MRI system. This in turn reduces the manufacturing cost and weight of the MRI systems. Further, implementing the cryogenic cooling system 100 as described hereinabove reduces downtimes and maintenance costs of the cryogenic cooling system 100.

Moreover, some MRI systems allow recondensing of the liquid helium, thus maintaining a constant liquid helium fill level. These systems allow use of more aggressive EPI sequences, while still maintaining a zero boil-off of the liquid helium. In addition, the reduction in thermal shield temperature and in general of the heat loads imposed on the superconducting magnet provided by the exemplary cryogenic cooling system 100 prolong the cryocooler time to service interval. Other examples of MRI systems entail use of a small liquid helium inventory of about 30 liters. For these MRI systems, the reduction of the heat loads imposed thereof and maintenance of temperature uniformity of the cryogenic environment is of utmost importance.

FIGS. 2-3 are diagrammatical representations of a compression stroke and an expansion stroke of the cryogenic cooler 106 in the cryogenic cooling system 100 of FIG. 1. Also, FIGS. 2-3 are described with reference to the components of FIG. 1.

Referring to FIG. 2, a cross-sectional view 200 of a cylindrical housing depicting a compression stroke in the cryogenic cooling system 100, in accordance with aspects of the present specification, is illustrated. Reference numeral 202 is representative of the cylindrical housing 110, while reference numeral 204 is representative of the displacer 114. Also, the cylindrical housing 202 has a first end 206 and a second end 208. In this embodiment, the cylindrical housing 202 includes two ports, such as a first port 214 and a second port 216 at the second end 208 of the cylindrical housing 202. The first port 214 is used for supplying a refrigerant gas 218 from the cylindrical housing 202 to a tubing unit such as the tubing unit 108, while the second port 216 is used for supplying the heated refrigerant gas from the tubing unit to the cylindrical housing 202.

During the compression stroke, the displacer 204 is driven from the first end 206 to the second end 208 of the cylindrical housing 202 in a direction 210 to compress the refrigerant gas 218 in a gas chamber 212. Also, compressing the refrigerant gas 218 may result in a pressure of the refrigerant gas 218 gradually increasing above a threshold value. If the pressure of the refrigerant gas 218 increases above the threshold value, the refrigerant gas 218 is supplied to the tubing unit via the first port 214. The refrigerant gas 218 is conveyed through the tubing unit to absorb or dissipate heat from heat loads such as the heat loads 150 that are imposed on the superconducting unit 102.

Turning now to FIG. 3, a cross-sectional view 300 of a cylindrical housing depicting an expansion stroke in the cryogenic cooling system 100, in accordance with aspects of the present specification, is illustrated. Reference numeral 302 is representative of the cylindrical housing 110. Also, reference numeral 304 is representative of the displacer 114. The cylindrical housing 302 has a first end 308 and a second end 306. In this embodiment, the cylindrical housing 302 includes two ports, such as a first port 314 and a second port 316 at the second end 306 of the cylindrical housing 302. The first port 314 is used for supplying a refrigerant gas 318 from the cylindrical housing 302 to a tubing unit such as the tubing unit 108, while the second port 316 is used for supplying the heated refrigerant gas from the tubing unit to the cylindrical housing 302.

During the expansion stroke, the displacer 304 is driven from the second end 306 to the first end 308 of the cylindrical housing 302 in a direction 310 to expand the refrigerant gas 318 in the gas chamber 302. Also, while the displacer 304 is moving towards the first end 308 of the cylindrical housing 302, the heated refrigerant gas is channeled from the tubing unit to a gas chamber 312 in the cylindrical housing 302 via the second port 316.

Figure 4:
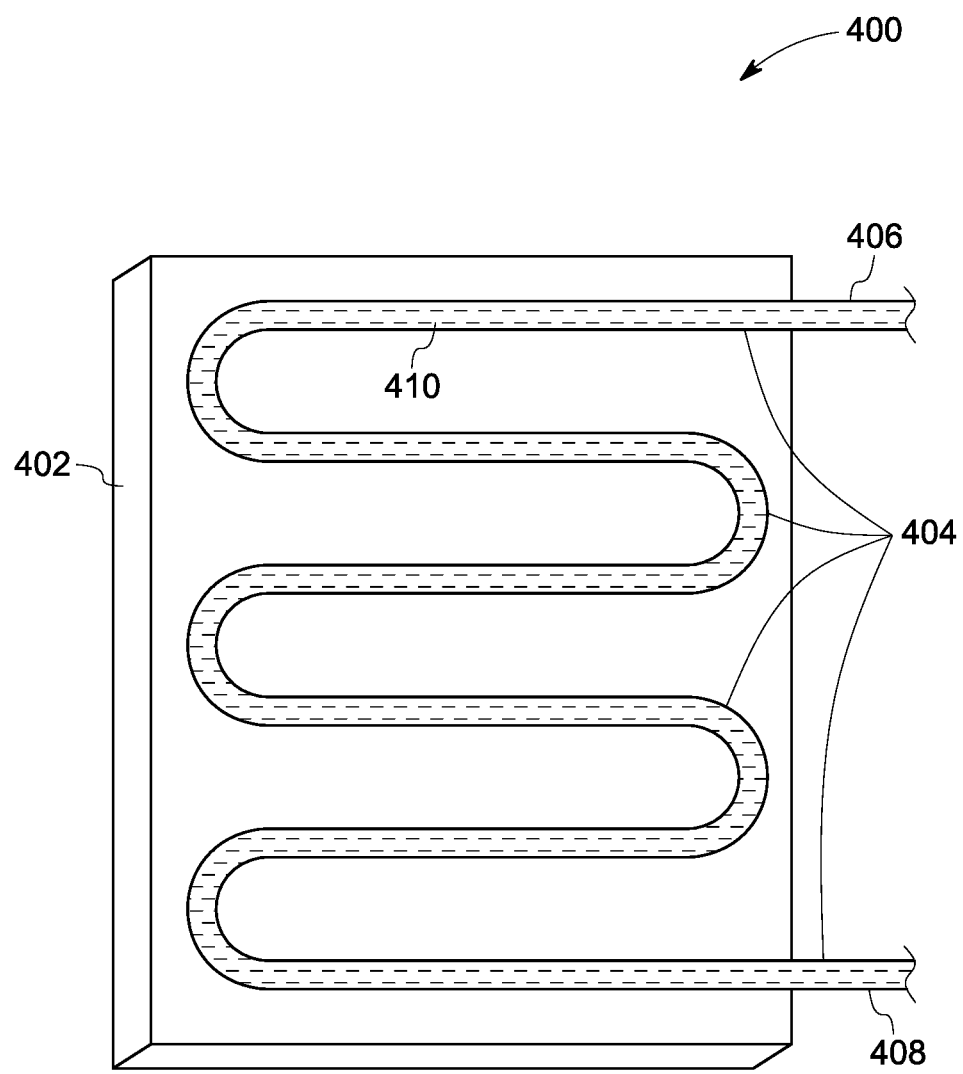
FIG. 4 is a diagrammatical representation of one embodiment of a tubing unit of FIG. 1, in accordance with aspects of the present specification.

FIG. 4 is a diagrammatical representation of one embodiment of a tubing unit 400, in accordance with aspects of the present specification. Also, FIG. 4 is described with reference to the components of FIG. 1.

This tubing unit 400 is configured for use in the cryogenic cooling system 100 of FIG. 1. In a presently contemplated configuration, the tubing unit 400 includes a thermal shield 402 having imprinted tubes 404 that are used for conveying a refrigerant gas 410. In one example, the imprinted tubes 404 may be representative of a hollow passage or a tube-like structure formed within the thermal shield 402 for conveying the refrigerant gas 410. In one embodiment, two sheets of thin walled tracks/channels are coupled or welded to each other to form the thermal shield 402. Further, pressure is introduced into these walled tracks to form a tube-like structure in the thermal shield 402. The tube-like structure so formed is representative of the imprinted tubes 404. In one example, the thermal shield 402 may be aluminum plates or sheets having a thickness in a range from about 0.5 mm to 2 mm. In another example, the imprinted tubes 404 may have an elliptical or circular channel diameter in a range from about 0.5 mm to about 5 mm. In one embodiment, these tubes 404 may be imprinted as serpentine capillaries having an inlet 406 and outlet 408.

During operation of the system 100, this thermal shield 402 may absorb the heat loads 150 that are imposed on the superconducting unit 102. In one example, the head loads 150 may be absorbed by the thermal shield 402 and uniformly distributed across the thermal shield 402. Further, these absorbed head loads are transferred to the refrigerant gas 410 that is conveyed through the imprinted tubes 404 in the thermal shield 402. In one example, the imprinted tubes 404 may be positioned across the thermal shield 402. Further, when the refrigerant gas 410 is conveyed through these imprinted tubes 404, the thermal shield 402 is uniformly cooled by the flow of the refrigerant gas 410 in the imprinted tubes 404. Moreover, the heated refrigerant gas is then conveyed to the compressor 104 via the cryogenic cooler 106. Thus, the thermal shield 402 having the imprinted tubes 404 facilitates the transfer of the heat loads 150 away from the superconducting unit 102, thereby maintaining the temperature of the superconducting unit 102 at or below the cryogenic temperature or reducing the temperature of the superconducting unit 102 to or below the cryogenic temperature.

Figure 5:
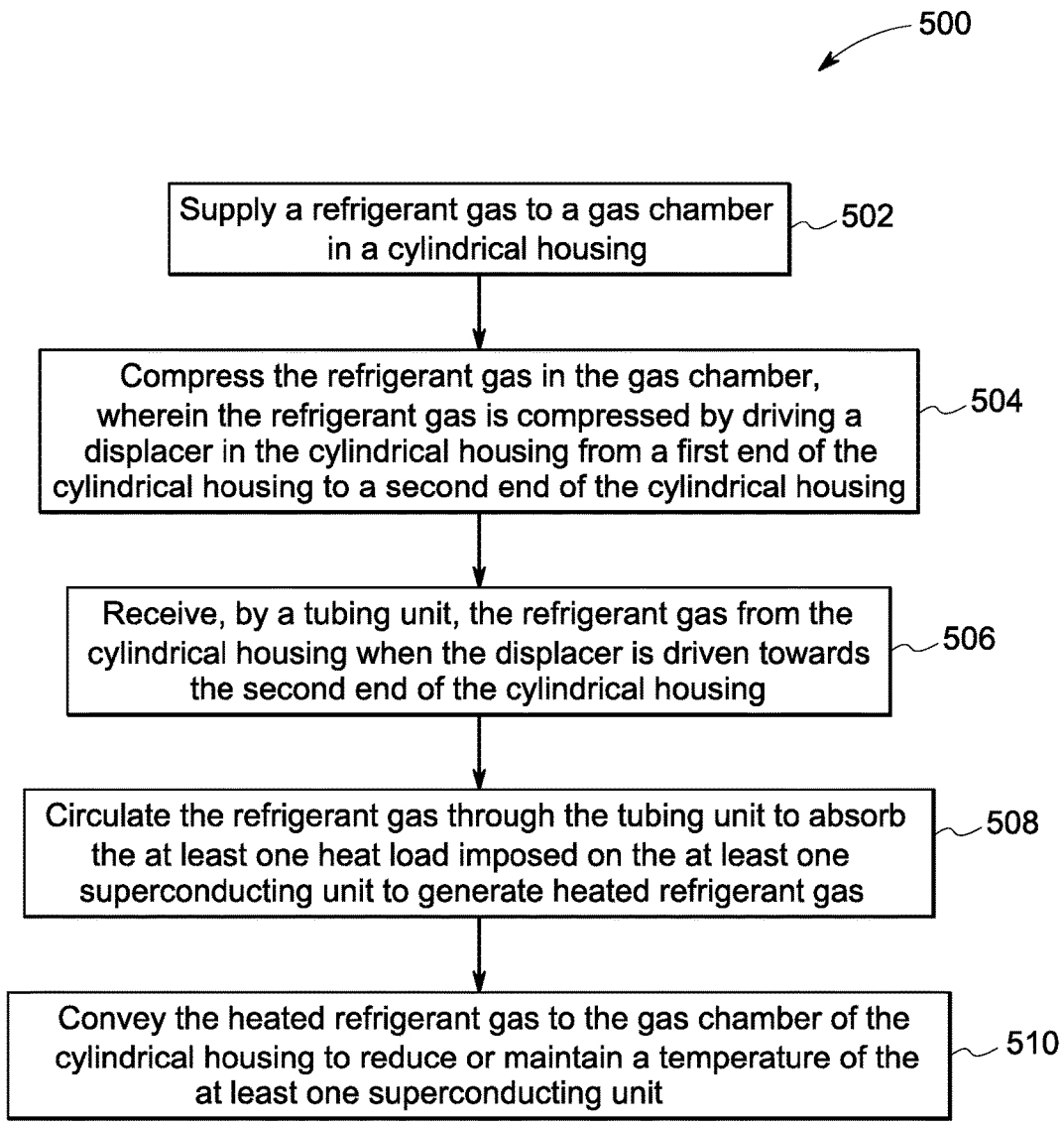
FIG. 5 is a flow chart illustrating a method for cooling a superconducting unit using the cryogenic cooling system of FIG. 1, in accordance with aspects of the present specification.

Referring to FIG. 5, a flow chart illustrating a method 500 for cooling a superconducting unit using a cryogenic cooling system, in accordance with aspects of the present specification, is depicted. For ease of understanding of the present specification, the method 500 is described with reference to the components of FIG. 1. As previously noted, the cryogenic cooling system 100 includes the compressor 104, the cryogenic cooler 106, and the tubing unit 108, where the compressor 104 is configured to store the refrigerant gas 103 that is used for cooling the superconducting unit 102.

The method 500 begins at step 502, where the refrigerant gas 103 is supplied to the gas chamber 120 in the cylindrical housing 110 of the cryogenic cooler 106. In particular, the compressor 104 is configured to supply the refrigerant gas 103 to the gas chamber 120 via the valve assembly 112 of the cryogenic cooler 106. To that end, the rotary valve 132 of the valve assembly 112 is rotated or opened to convey the refrigerant gas 103 from the outlet 136 of the compressor 104 to the gas chamber 120 in the cylindrical housing 110 via the valve stem 134 and the drive stem 128.

Further, at step 504, the displacer 114 in the cylindrical housing 110 is driven from the first end 116 of the cylindrical housing 110 to the second end 118 of the cylindrical housing 110 to compress the refrigerant gas in the gas chamber 120. Particularly, the drive stem 128 of the drive unit 124 of the valve assembly 112 is coupled to the displacer 114 at the first end 116 of the cylindrical housing 110 to aid in driving the displacer 114 from the first end 116 to the second end 118 of the cylindrical housing 110. Moreover, the refrigerant gas in the gas chamber 120 may be compressed when the displacer 114 is moved towards the second end 118 of the cylindrical housing 110.

Subsequently, at step 506, the tubing unit 108 may receive the refrigerant gas from the cylindrical housing 110 when the displacer 114 is driven towards the second end 118 of the cylindrical housing 110. In one embodiment, as the refrigerant gas in the gas chamber 120 is compressed, the pressure of the refrigerant gas may increase above a threshold value. If the pressure of the refrigerant gas increases above the threshold value, the gas valve 140 in the tubing unit 108 is turned to the first position to convey the refrigerant gas from the gas chamber 120 to the inlet 142 of the tubing unit 108 via the port 122.

Furthermore, at step 508, the refrigerant gas is circulated through the tubing unit 108 to aid in absorbing the heat loads 150 that are imposed on the superconducting unit 102. In one example, the refrigerant gas is conveyed from the inlet 142 of the tubing unit 108 to the outlet 144 of the tubing unit 108. Also, while circulating the refrigerant gas, the tubing unit 108 absorbs the heat loads 150 imposed on the superconducting unit 102 and transfers the absorbed heat loads to the refrigerant gas in the tubing unit 108. As a result, the refrigerant gas in the tubing unit 108 is heated to generate heated refrigerant gas.

Additionally, at step 510, the tubing unit 108 conveys the heated refrigerant gas to the gas chamber 120 of the cylindrical housing 110 when the displacer 114 is driven towards the first end 116 of the cylindrical housing 110. Particularly, the displacer 114 is driven from the second end 118 to the first end 116 of the cylindrical housing 110 to expand the refrigerant gas in the gas chamber 120. This expansion of the refrigerant gas may result in a gradual decrease in the pressure of the refrigerant gas. In certain situations, the pressure of the expanding refrigerant gas may be reduced below the threshold value. If the pressure of the refrigerant gas drops below the threshold value, the gas valve 140 is turned to the second position to receive the heated refrigerant gas from the outlet 144 of the tubing unit 108.

Also, the heated refrigerant gas is conveyed from the outlet 144 of the tubing unit 108 to the gas chamber 120 in the cylindrical housing 110 via the port 122. Further, the rotary valve 132 of the valve assembly 112 is rotated or opened to convey the heated refrigerant gas from the gas chamber 120 to the inlet 138 of the compressor 104 via the valve stem 134 and the drive stem 128. Moreover, the heated refrigerant gas is collected in the compressor 104 via the inlet 138. Furthermore, this cycle of supplying the refrigerant gas to the tubing unit 108 and receiving the heated refrigerant gas from the tubing unit 108 is repeated to transfer the heat loads 150 imposed on the superconducting unit 102, thereby reducing the temperature of the superconducting unit 102 to the cryogenic temperature or below the cryogenic temperature and/or maintaining the temperature of the superconducting unit 102 at the cryogenic temperature or below the cryogenic temperature.

Figure 6:
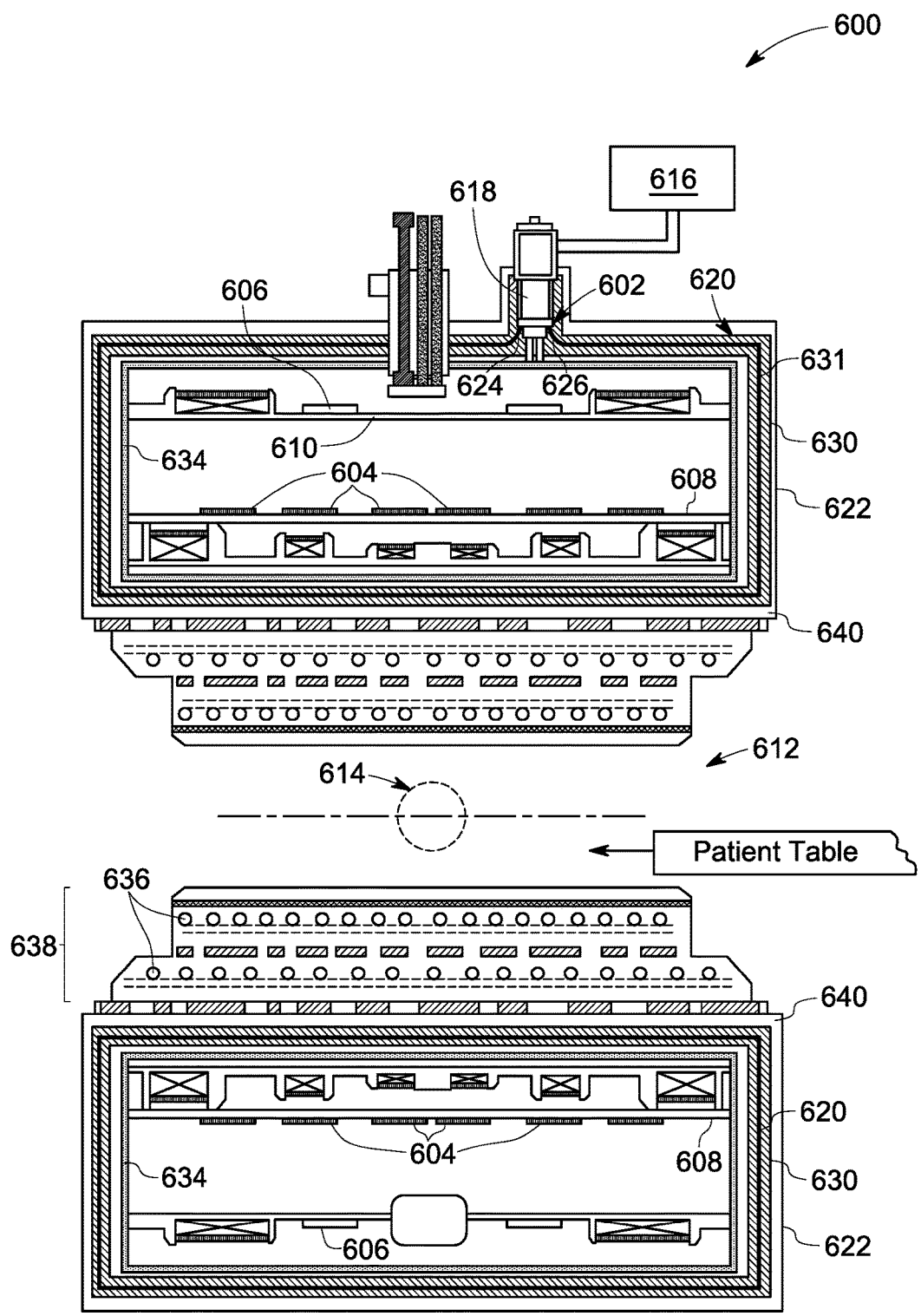
FIG. 6 is a schematic view of a magnetic resonance imaging system that includes the cryogenic cooling system of FIG. 1, in accordance with aspects of the present specification.

FIG. 6 is a cross sectional view of an MRI system 600 that includes a cryogenic cooling system 602, in accordance with aspects of the present specification. The cryogenic cooling system 602 is representative of one embodiment of the cryogenic cooling system 100 of FIG. 1. In this embodiment, the MRI system 600 includes a superconducting MRI magnet formed from concentric superconducting main coils 604 and bucking coils 606 supported inside cylindrical shells of high thermal conductivity, and cooled by a cryogenic cooling system 602.

The superconducting coils 604 and/or the bucking coils 606 are molded with epoxy resin. For example, the molded coils may be wound with wet epoxy and cured to form self-supporting structures. The superconducting coils 604 and the bucking coils 606 may be bonded to coil support shells 608 and 610, respectively. Also, in this embodiment, the superconducting coils 604 and the bucking coils 606 are surrounded by a helium vessel 634. In this embodiment, the superconducting coils 604 are operated at a low temperature that is in a range from about 3.3 K to 6.5 K. The formed superconducting coils 604 and/or the bucking coils 606 are sized to define a bore 612 therethrough. An object such as a patient to be imaged may be positioned within the bore 612. Further, a field of view (FOV) 614 of the bore 612 may be defined to image a desired portion of the object.

In the embodiment of FIG. 6, the cryogenic cooling system 602 includes a compressor 616, a cryogenic cooler 618, and a tubing unit 620. These components 616, 618, 620 of the cryogenic cooling system 602 are contained inside a magnet vacuum vessel 622. The compressor 616, the cryogenic cooler 618, and the tubing unit 620 may be similar to the compressor 104, the cryogenic cooler 106, the tubing unit 108 of FIG. 1, respectively. The compressor 616 may be configured to store a refrigerant gas, such as helium (He).

Further, the tubing unit 620 may be formed by a thermal shield 630 having imprinted tubes 631 positioned around an inner surface of the vacuum vessel 622. In this embodiment, the thermal shield 630 is positioned between the vacuum vessel 622 and the helium vessel 634. In one embodiment, the thermal shield 630 may be disposed in a vacuum space 640 and may act as a thermal envelop around the helium vessel 634. In operation, the imprinted tubes 631 in the tubing unit 620 may receive the refrigerant gas, such as He from the compressor 616 via the cryogenic cooler 618. This refrigerant gas may flow from an inlet 624 of the tubing unit 620 to an outlet 626 of the tubing unit 620. As the refrigerant gas is conveyed/circulated through the imprinted tubes 631, heat loads that are imposed on the superconducting coils 604 and/or bucking coils 606 are absorbed by the thermal shield 630 and transferred to the refrigerant gas flowing in the imprinted tubes 631. In one example, these head loads may be imposed by one or more gradient coils/switches 636 of a gradient assembly 638. In another example, the heat loads may be due to varying thermal radiation from the vacuum space 640 in the MRI system 600. It may be noted that the MRI system 600 also includes a service box, receiving power leads for powering the coils 604 and 606, as well as other components. Thus, by employing the exemplary cryogenic cooling system 602, the head loads are transferred away from the coils 604, 606 in the system. This in turn aids in restricting the heat loads from reaching the coils 604, 606 and maintaining these coils 604, 606 at or below the cryogenic temperature.

Figure 7:
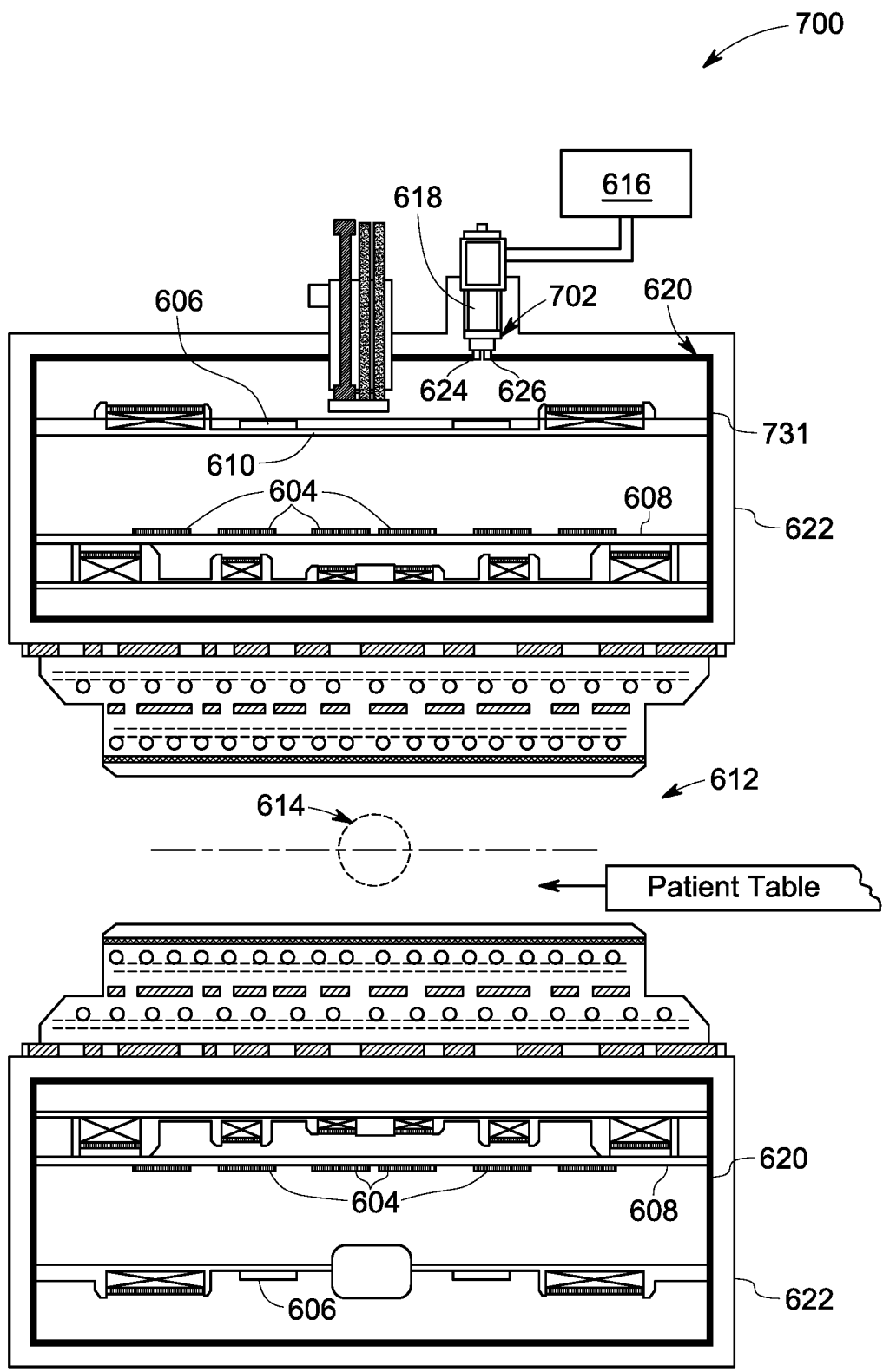
FIG. 7 is a schematic view of a magnetic resonance imaging system that includes another embodiment of the cryogenic cooling system of FIG. 1, in accordance with aspects of the present specification.

FIG. 7 is a cross sectional view of an MRI system 700 that includes a cryogenic cooling system 702, in accordance with aspects of the present specification. The cryogenic cooling system 702 is similar to the cryogenic cooling system 602 of FIG. 6. However, the embodiment of the MRI system 700 of FIG. 7 does not include the helium vessel 634 and the thermal shield 630 is excluded from the cryogenic cooling system 702. In the example of FIG. 7, the tubing unit 702 includes one or more capillaries 731 that are positioned around the superconducting coils 604, the bucking coils 606, and the coil support shells 608, 610 to directly cool the coils 604, 606 and the coil support shells 608, 610 in the system 700. In various embodiments, once the cryogenic cooling system 702 is turned ON, the tubing unit 620 receives the refrigerant gas from the compressor 616 and sets up a forced convection loop that cools down the coils 604, 606 and the coil support shells 608, 610 to a cryogenic temperature. This kind of arrangement is used for high temperature superconducting coils that need direct cooling. In one example, the superconducting coils 604 may be operated at a temperature from about 10 K to about 100 K.

The various embodiments of the exemplary cryogenic cooling systems and the method for cooling the superconducting units described hereinabove aid in reducing the manufacturing costs and weight of the MRI systems. Also, service intervals of the cryogenic cooling systems may be substantially increased. In addition, the systems and method may be retrofit to existing MRI systems to provide maximum cooling efficiency with minimal configuration changes to the existing cooling arrangements in the MRI systems. Further, the higher cooling efficiency of the cryogenic cooling system aids in enhancing the performance of the superconducting coils to a higher level, while simultaneously increasing the cryostability of the superconducting unit. Also, as the imprinted tubes are used in the thermal shield, the thickness of the thermal shield may be substantially reduced. Further, as the cryogenic cooler increases the pressure of the refrigerant gas, the refrigerant gas may be conveyed through the tubing unit irrespective of the orientation and/or position of the tubing unit in the MRI system.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A cryogenic cooling system configured to absorb at least one heat load imposed on at least one superconducting unit, comprising:
   a cryogenic cooler contained inside a magnet vacuum vessel and comprising a cylindrical housing, wherein the cylindrical housing has a first end and a second end, wherein the cylindrical housing comprises a gas chamber at the second end, and wherein the gas chamber is configured to house a refrigerant gas;
   a displacer disposed within the cylindrical housing, wherein the displacer is reciprocatingly driven between the first end and the second end of the cylindrical housing to compress or expand the refrigerant gas in the gas chamber;
   a tubing unit coupled to the second end of the cylindrical housing and disposed adjacent to the at least one superconducting unit, wherein the tubing unit is configured to:
      receive the refrigerant gas from the gas chamber at an inlet of the tubing unit when a pressure of the refrigerant gas in the gas chamber is above a threshold value;
      circulate the refrigerant gas received from the cylindrical housing through the tubing unit to absorb the at least one heat load imposed on the at least one superconducting unit to generate heated refrigerant gas; and
      convey the heated refrigerant gas from an outlet of the tubing unit to the gas chamber of the cylindrical housing when the pressure of the refrigerant gas in the gas chamber is below the threshold value.

2. The cryogenic cooling system of claim 1, wherein the cryogenic cooler further comprises a valve assembly, and wherein the valve assembly comprises:
   a driving unit coupled to the displacer at the first end of the cylindrical housing, wherein the driving unit is configured to reciprocatingly drive the displacer between the first end and the second end of the cylindrical housing;
   a valve unit coupled to the cylindrical housing and configured to:
      convey the refrigerant gas from a compressor to the gas chamber in the cylindrical housing; and
      convey the heated refrigerant gas from the gas chamber in the cylindrical housing to the compressor.

3. The cryogenic cooling system of claim 1, wherein the cylindrical housing comprises a port at the second end of the cylindrical housing, and wherein the port is configured to:
convey the refrigerant gas from the cylindrical housing to the tubing unit; and
convey the heated refrigerant gas from the tubing unit to the cylindrical housing.

4. The cryogenic cooling system of claim 3, wherein the tubing unit is contained inside the magnet vacuum vessel and comprises a gas valve coupled to the port, and wherein the gas valve is configured to regulate a flow of the refrigerant gas into the tubing unit.

5. The cryogenic cooling system of claim 4, wherein the inlet and the outlet coupled to the gas valve, and wherein the gas valve is turned to a first position to convey the refrigerant gas from the cylindrical housing to the inlet of the tubing unit.

6. The cryogenic cooling system of claim 5, wherein the gas valve is turned to a second position to convey the heated refrigerant gas from the outlet of the tubing unit to the cylindrical housing.

7. The cryogenic cooling system of claim 1, wherein the tubing unit comprises a plurality of capillaries disposed adjacent to the at least one superconducting unit, wherein the plurality of capillaries is configured to absorb the at least one heat load imposed on the at least one superconducting unit, and wherein the plurality of capillaries includes at least one of serpentine capillaries and circular capillaries.

8. The cryogenic cooling system of claim 1, wherein the tubing unit comprises a thermal shield having a plurality of imprinted tubes disposed adjacent to the at least one superconducting unit, and wherein the plurality of imprinted tubes is configured to absorb the at least one heat load imposed on the at least one superconducting unit.

9. A method for absorbing at least one heat load imposed on at least one superconducting unit, the method comprising:
supplying a refrigerant gas to a gas chamber in a cylindrical housing of a cryogenic cooler of a cryogenic cooling system, wherein the cryogenic cooler is contained inside a magnet vacuum vessel;
compressing the refrigerant gas in the gas chamber by driving a displacer in the cylindrical housing from a first end of the cylindrical housing to a second end of the cylindrical housing;
receiving, by a tubing unit, the refrigerant gas from the cylindrical housing when a pressure of the refrigerant gas in the gas chamber is above a threshold value;
circulating the refrigerant gas through the tubing unit to absorb the at least one heat load imposed on the at least one superconducting unit to generate heated refrigerant gas;
expanding the refrigerant gas in the gas chamber by driving the displacer from the second end to the first end; and
conveying the heated refrigerant gas to the gas chamber of the cylindrical housing to reduce or maintain a temperature of the at least one superconducting unit, wherein the heated refrigerant gas is conveyed to the gas chamber when the pressure of the refrigerant gas in the gas chamber is below the threshold value.

10. The method of claim 9, further comprising:
supplying, by a valve assembly of the cryogenic cooler, the refrigerant gas to the gas chamber of the cylindrical housing before the displacer is driven towards the second end of the cylindrical housing; and
receiving, by the valve assembly, the heated refrigerant gas from the cylindrical housing after the displacer is driven towards the first end of the cylindrical housing.

11. The method of claim 9, further comprising regulating, by a gas valve, a flow of the refrigerant gas into the tubing unit.

12. The method of claim 11, further comprising:
turning the gas valve to a first position to convey the refrigerant gas from the cylindrical housing to an inlet of the tubing unit; and
turning the gas valve to a second position to convey the heated refrigerant gas from an outlet of the tubing unit to the cylindrical housing.

13. The method of claim 9, further comprising circulating the refrigerant gas through the tubing unit without using an external pump.

14. A system, comprising:
a magnetic resonance imaging sub-system comprising at least one superconducting unit configured to produce a magnetic field;
a cryogenic cooling sub-system coupled to the at least one superconducting unit and configured to absorb at least one heat load imposed on the at least one superconducting unit, wherein the cryogenic cooling device comprises:
a cryogenic cooler contained inside a magnet vacuum vessel and comprising a cylindrical housing, wherein the cylindrical housing has a first end and a second end, wherein the cylindrical housing comprises a gas chamber at the second end, and wherein the gas chamber is configured to house a refrigerant gas;
a displacer disposed within the cylindrical housing, wherein the displacer is reciprocatingly driven between the first end and the second end of the cylindrical housing to compress or expand the refrigerant gas in the gas chamber;
a tubing unit coupled to the second end of the cylindrical housing and disposed adjacent to the at least one superconducting unit, wherein the tubing unit is configured to:
receive the refrigerant gas from the gas chamber at an inlet of the tubing unit when a pressure of the refrigerant gas in the gas chamber is above a threshold value;
circulate the refrigerant gas received from the cylindrical housing through the tubing unit to absorb the at least one heat load imposed on the at least one superconducting unit to generate heated refrigerant gas; and
convey the heated refrigerant gas from an outlet of the tubing unit to the gas chamber of the cylindrical housing when the pressure of the refrigerant gas in the gas chamber is below the threshold value.

15. The system of claim 14, wherein the tubing unit is contained inside the magnet vacuum vessel and comprises a gas valve configured to:
convey the refrigerant gas from the cylindrical housing to an inlet of the tubing unit; and
convey the heated refrigerant gas from an outlet of the tubing unit to the cylindrical housing.

16. The system of claim 14, wherein the tubing unit comprises a plurality of imprinted tubes disposed adjacent to the at least one superconducting unit, and wherein the plurality of imprinted tubes is configured to absorb the at least one heat load imposed on the at least one superconducting unit.

17. The system of claim 14, wherein the cryogenic cooling sub-system is configured to absorb the at least one heat load imposed on the at least one superconducting unit to maintain a temperature of the at least one superconducting unit at or below a cryogenic temperature or reduce the temperature of the at least one superconducting unit to or below the cryogenic temperature.

18. The system of claim 14, wherein the tubing unit comprises a plurality of capillaries disposed adjacent to the at least one superconducting unit, wherein the plurality of capillaries is configured to absorb the at least one heat load imposed on the at least one superconducting unit, and wherein the plurality of capillaries includes at least one of serpentine capillaries and circular capillaries.

19. The system of claim 14, further comprising a driving unit coupled to the displacer at the first end of the cylindrical housing, wherein the driving unit is configured to reciprocatingly drive the displacer between the first end and the second end of the cylindrical housing.

20. The system of claim 14, wherein the refrigerant gas is circulated through the tubing unit without use of an external pump.

\* \* \* \* \*